United States Patent
Rana et al.

(10) Patent No.: US 7,429,880 B2
(45) Date of Patent: Sep. 30, 2008

(54) REDUCED GLITCH DYNAMIC LOGIC CIRCUIT AND METHOD OF SYNTHESIS FOR COMPLEMENTARY OXIDE SEMICONDUCTOR (CMOS) AND STRAINED/UNSTRAINED SILICON-ON-INSULATOR (SOI)

(76) Inventors: Amar Pal Singh Rana, P.O. Box 2279, Sunnyvale, CA (US) 94087; Nirmal Singh, P.O. Box 2279, Sunnyvale, CA (US) 94087

( * ) Notice: Subject to any disclaimer, the term of this patent is extended or adjusted under 35 U.S.C. 154(b) by 1119 days.

(21) Appl. No.: 10/638,756

(22) Filed: Aug. 11, 2003

(65) Prior Publication Data
US 2007/0262792 A1 Nov. 15, 2007

(51) Int. Cl.
  H03K 19/20 (2006.01)
  H03K 19/094 (2006.01)
  H03K 19/096 (2006.01)
(52) U.S. Cl. .................... 326/98; 326/112
(58) Field of Classification Search .......... 326/112
  See application file for complete search history.

(56) References Cited

U.S. PATENT DOCUMENTS

| | | | |
|---|---|---|---|
| 5,208,490 A | 5/1993 | Yetter | |
| 5,291,076 A * | 3/1994 | Bridges et al. | 326/52 |
| 5,323,071 A * | 6/1994 | Hirayama | 326/68 |
| 5,517,136 A | 5/1996 | Harris et al. | |
| 5,892,372 A | 4/1999 | Ciraula et al. | |
| 5,903,467 A | 5/1999 | Puri et al. | |
| 6,040,716 A | 3/2000 | Bosshart | |
| 6,225,826 B1 | 5/2001 | Krishnamurthy et al. | |
| 6,377,080 B1 | 4/2002 | Arnold | |
| 6,492,839 B2 * | 12/2002 | Wang et al. | 326/98 |
| 6,529,861 B1 | 3/2003 | Patra et al. | |
| 6,549,040 B1 | 4/2003 | Alvandpour et al. | |

OTHER PUBLICATIONS

R.H. Krambeck, et al. "High Speed Compact Circuits With CMOS", IEEE JSSC SC-17(3) Jun. 1982; 614-617.

* cited by examiner

Primary Examiner—James H. Cho
Assistant Examiner—Matthew C Tabler

(57) ABSTRACT

The present invention implements structures and method for non-delayed clock dynamic logic circuit configurations with output and/or complementary output with reduced glitch and/or mitigating adverse charge-sharing effects for Complementary Oxide Semiconductor (CMOS) and/or mitigating parasitic bipolar action in Strained/Unstrained Silicon-On-Insulator (SOI) circuits, where insulator may be oxide, nitride of Silicon and the like or Sapphire and the like including a method of synthesis.

18 Claims, 10 Drawing Sheets

US 7,429,880 B2

REDUCED GLITCH DYNAMIC LOGIC CIRCUIT AND METHOD OF SYNTHESIS FOR COMPLEMENTARY OXIDE SEMICONDUCTOR (CMOS) AND STRAINED/UNSTRAINED SILICON-ON-INSULATOR (SOI)

BACKGROUND OF THE INVENTION

1. Technical Field

The present invention generally relates to integrated circuits (ICs). More particularly, the present invention relates to ICs incorporating dynamic or domino logic circuits.

2. Glossary of Terms

Bulk-CMOS refers to Complementary Metal Oxide Semiconductor and refers to a design and fabrication technology for semiconductors.

SOI where Insulator is Oxide or nitride of Silicon and the like or Sapphire. The SOI field effect transistor n-type has a parallel parasitic bipolar NPN transistor associated with it. The drain of the n-type is equivalent to the collector of the parasitic bipolar transistor. The source of the n-type is equivalent to the emitter of the parasitic bipolar transistor. The body of the n-type becomes charged by induced leakage whenever the drain and source terminals are held at a high potential. If the source is dropped to a low potential the trapped charged in the body causes a current to flow from the base of the parasitic bipolar transistor. This causes a current to flow in the collector that is parallel to a current flowing in the drain. This action may discharge the drain node of a dynamic circuit and may result in erroneous evaluation. The SOI device may be strained by introducing another material with different atomic size than Silicon e.g. Germanium and the like.

A Metal Oxide Semiconductor (MOS) transistor has 2 electrodes referred to as the source and the drain and a control electrode as the gate. A transistor has a bulk connection which may be floating e.g. in SOI.

N-type is a Metal Oxide Semiconductor (MOS) transistor with electrons as majority carriers.

P-type is a Metal Oxide Semiconductor (MOS) transistor with holes as majority carriers Primitives are technology independent gates e.g. AND gates, OR gates, NOT etc.

NAND gate is inversion of AND and NOR is inversion of OR.

A Register Transfer Level Description is a high level abstraction of a logic design. It comprises logic functions to be implemented in an integrated circuit. Interface constraints and a technology data-base may be specified. An example of a language that may be used for RTL description is VHDL or Verilog etc.

.lib is the well-known Synopsys library format.

Expressions are the product of parsing register transfer level statements and may be utilized as the starting point in a logic description.

Digital design Synthesis is used to mean the synthesis of a technology dependent model from a register transfer level description or from interconnected functional blocks to result in standard-cell mapped design from a target library, or result in a combination of standard-cell mapped design from a target library and a transistor level representation for part or all of the input design specification.

Under DeMorgan's theorem, a NAND gate with inverted inputs performs an OR function and a NOR gate with inverted inputs performs an AND function.

A short-circuit occurs when there is a path of zero or almost zero resistance between a first known voltage level and a second known voltage level.

A non-inverting node has no inversion e.g. AND, OR and the like or a combination of these.

An inverting node has inversion e.g. NAND, NOR, NOT and the like or a combination of these.

Domino logic circuits are discussed in "High-Speed Compact Circuits with CMOS", Krambeck et al., IEEE Journal of Solid-State Circuits, Vol. SC-17, No. 3, June 1982, pp. 614-619, and "High-Speed CMOS Design Styles", Kluwer Academic Publishers, Boston, 1998, pp. 93-98 and U.S. Pat. No. 5,291,076 issued to Bridges et. al. on Mar. 1, 1994 and U.S. Pat. No. 6,225,826 issued to Krishnamurthy et. al on May 1, 2001 and are dynamic in nature with precharge and evaluation clock to provide output and/or complementary output.

3. Description of the Related Art

Digital circuits often require true and complementary boolean logic functions. Dynamic or Domino circuits require conversion to non-inverting only stages and may result in some duplication resulting in increased area and power consumption. To avoid this duplication, a dual output implementation (including true and/or complementary versions of the domino stage) is used.

For example, A dynamic cascode switching arrangement as prior art of U.S. Pat. No. 5,291,076 issued to Bridges et. al. on Mar. 1, 1994 is depicted in FIG. 1 of a precharge device 28. Precharge device 28 is implemented as a NOR gate. This design allows precharge device 28 to have a large number of input signals without reducing its performance. Precharge device 28 has a CLOCK and a transistor tree 29 and two nodes 30 and 32. Tree 29 is connected between nodes 30 and 32 and contains logic circuits operable to electrically short-circuit nodes 30 and 32 together given a predetermined set of inputs as will be described below. The transistor tree 29 contains three transistors Q14, Q15, and Q16 connected in parallel between nodes 30 and 32. The gates of transistors Q14, Q15 and Q16 are connected to the input signals $A_1$, $A_2$ and $A_3$, respectively. The drains of transistors Q14, Q15, and Q16 are connected to node 30. The sources of transistors Q14, Q15, and Q16 are connected to node 32.

Precharge device 28 also has two clocking transistors Q17 and Q18, an evaluate transistor Q19 and a screening transistor Q20. The gates of clocking transistors Q17 and Q18 and evaluate transistor Q19 are connected to a periodic timing signal, CLOCK. The drains of clocking transistors Q17 and Q18 are connected to a voltage supply. $V_{DD}$. The source of clocking transistor Q17 is connected to node 30. The source of clocking transistor Q18 is connected to an output node 34. Evaluate transistor Q19 has its drain and source connected to node 32 and to ground, respectively. Screening transistor Q20 has its gate connected to node 30, its drain connected to output node 34 and its source connected to node 32.

Precharge device 28 may have two latching transistors Q21 and Q22 to improve the resistance of precharge device 28 to inherent circuit instabilities. Both of the drains of latching transistors Q21 and Q22 are connected to $V_{DD}$. The source and gate of latching transistor Q21 are connected to nodes 30 and 34, respectively. Conversely, the source and gate of latching transistor Q22 are connected to nodes 34 and 30, respectively.

The output of precharge device 28, OUTPUT*, is generated by the voltage at node 34 inverted and buffered by an inverter 36. An inverter 37 connected to node 30 generates the signal OUTPUT. As depicted, all transistors in precharge device 28 are n-channel devices with the exception of clocking transistors Q17 and Q18 and latching transistors Q21 and Q22. Clocking transistors Q17 and Q18 and latching transistors Q21 and Q22 are p-channel devices.

Node 30 is discharged if any of the inputs $A_1$, $A_2$, and $A_3$ are a logic high which is input to inverter 36. However, one skilled in the art will readily appreciate the wide variety of applications for precharge device 28 with suitably modified transistor trees. The precharge device 28, has two stages, the precharge and evaluate stages correspond to a low and a high voltage on CLOCK, respectively.

In operation, precharge device 28 precharges nodes 30 and 34 to a known or predetermined voltage level when the input CLOCK is low. In the illustrated form, nodes 30 and 34 are precharged to $V_{DD}$. The output from inverters 36 and 37 are therefore initially low. Transistor Q20 causes a voltage drop between nodes 34 and 32 of $V_{TH}$, one transistor threshold voltage. Node 32 is therefore initially at a voltage of ($V_{DD}-V_{TH}$). When the input CLOCK switches high, precharge device 28 evaluates the voltage present on node 30. In the evaluation stage if inputs through transistors Q14 or Q15 or Q16 result in a conductive path, the voltage at node 30 is discharged to a second known or predetermined voltage level through clocking transistor Q19. In the illustrated form, node 30 is discharged to ground, $V_{SS}$. The voltage on node 32 also drops to ground, $V_{SS}$ as the input CLOCK places clocking transistor Q19 in a conducting state. As the voltage on node 30 drops, screening transistor Q20 ceases to conduct. The non conducting state of screening transistor Q20 prevents node 34 from discharging, maintaining the low output from inverter 36. The low voltage level on node 30, however, causes OUTPUT to switch to high.

In case that inputs to transistors Q14, Q15 or Q16 do not result in a conductive path in the evaluation stage. The precharge device, 28 implemented as a NOR gate is the combination of inputs, $A_1$, $A_2$, and $A_3$ that does not discharge node 30. In this state, precharge device 28 outputs a logic high signal through inverter 36.

As described above, precharge device 28 precharges nodes 30 and 34 to $V_{DD}$, precharges node 32 to ($V_{DD}-V_{TH}$) and outputs a logic low on inverters 36 and 37 when the input CLOCK is low. When the input CLOCK switches high, precharge device 28 evaluates the voltage present on node 30. If the inputs do not result in the voltage at node 30 to be discharged to $V_{SS}$, ground, a high voltage on node 30 places screening transistor Q20 in a conducting state. Evaluate transistor Q19 is placed in a conducting state by a high CLOCK signal. Node 34 then discharges to ground through screening transistor Q20 and evaluate transistor Q19. Inverter 36 inverts the low voltage on node 34 and outputs a high logic level. Inverter 37 inverts the high voltage at node 30 and continues to output a low logic signal as Node 32 discharges to ground.

In the evaluation stage, one or more of decode transistors Q14, Q15 or Q16 may, discharge node 30 to $V_{SS}$, ground. Node 30 discharges after a finite time which depends on the delay associated with the transistor tree 29, evaluation transistor Q19, screening transistor Q20, capacitance on node 30 and the cascade switching arrangement. This finite discharge time for node 30 places latching transistor Q22 into a non-conducting state during this finite time and is unable to supply voltage, $V_{DD}$, to node 34. The evaluate transistor Q19 turns on as soon as the CLOCK goes from precharge to evaluate stage. Worst of all, the screening transistor Q20 stays in the ON state for a finite time, giving rise to a glitch on node 34 and nothing to replenish it. Any additional keeper(s) if present also slow down this circuit due to contention on node 34. Further, if node 34 discharges below a certain threshold, inverter 36 would erroneously treat the voltage at node 34 as a logic low resulting an erroneous value on OUTPUT*. Dynamic circuits such as precharge device 28 are particularly susceptible to such erroneous loss of precharge and glitches are not tolerated on OUTPUT* as it may be input to other precharge devices similar to 28.

In another example, dynamic cascade switching arrangement prior art of U.S. Pat. No. 6,225,826 issued to Krishnamurthy et. al. on May 1, 2001 is depicted in FIG. 2 and includes a domino stage 202 including a series of parallel nFET transistors (represented by M42 and M43) that receive a domino stage input signal A1 . . . An. But without an evaluation transistor between the source(s) of A1 . . . An and $V_{SS}$ whose gate may have been connected to the CLK. In the precharge phase, when CLK is low, a node N1 is pulled high through a pFET transistor M40 and a node N2 is pulled high through a pFET transistor M45. With nodes N1 and N2 high, OUT and OUT* are low through inverters 210 and 212.

In the evaluate phase, CLK is high so that transistors M40 and M45 are off, but transistor M47 is on. If no bit of A1 . . . An is high, node N1 remains high and node N2 is pulled low through transistors M46 and M47. With node N2 low, OUT* is pulled high through inverter 212. If any of A1 . . . An is high, node N1 is pulled low after a finite time which depends on the delay associated with the transistor tree M42 . . . M43, screening transistor M44, capacitance on node N1 and the cascade switching arrangement.

This finite discharge time for node N1 places latching transistor M44 into a non-conducting state during this finite time and is unable to supply voltage, $V_{DD}$, to node N2. The evaluate transistor M47 turns on as soon as the CLOCK goes from precharge to evaluate stage. Worst of all, the screening transistor M46 stays in the ON state for a finite time, giving rise to a glitch on node N2 and nothing to replenish it. Any additional keeper(s) if present also slow down this circuit due to contention on node N2. Further, if node 34 discharges below a certain threshold, inverter 212 would erroneously treat the voltage at node N2 as a logic low resulting an erroneous value on OUT*. Dynamic circuits such as precharge device 202 are particularly susceptible to such erroneous loss of precharge and glitches are not tolerated on OUT* as it may be input to other precharge devices similar to 202.

A disadvantage of the prior art is the glitch problem makes the dynamic circuit very vulnerable to erroneous results as the loss of precharge cannot be compensated, while reducing the delay through this dynamic circuit.

Several prior art U.S. patents teach to delay the clock signal to generate a complementary output, e.g. U.S. Pat. No. 6,549,040 issued to Alvandpour et. al on Apr. 15, 2003, U.S. Pat. No. 6,225,826 issued to Krishnamurthy et. al. on May 1, 2001, U.S. Pat. No. 6,377,080 issued to Arnold on Apr. 23, 2002, U.S. Pat. No. 6,492,839 issued to Wang et. al on Dec. 10, 2002 and U.S. Pat. No. 5,892,372 issued to Ciraula et.al on Apr. 6, 1999. It is difficult to provide optimal delay within the semiconductor process variations, any extra delay with additional safety margin will slow down the circuit and shorter delay may result in glitch and race conditions.

SUMMARY OF THE INVENTION

It is, accordingly, an object of the present invention to reduce the glitch to a minimum, while keeping power consumption and delay through the circuit low to provide output signal and/or complementary output signal responsive to input signals.

It is also an object of the invention to mitigate adverse charge-sharing effects for Complementary Oxide Semiconductor (CMOS) and/or mitigating parasitic bipolar action in Strained/Unstrained Silicon-On-Insulator (SOI) circuits, where insulator may be oxide, nitride of Silicon and the like or Sapphire and the like including a method of synthesis.

BRIEF DESCRIPTION OF THE DRAWINGS

The features and advantages of the present invention will be more clearly understood from the following detailed description taken in conjunction with the accompanying FIGS. 1 to 11 of embodiments of the invention which, however, should not be taken to limit the invention to the specific embodiments described, but are for explanation and understanding only.

DETAILED DESCRIPTION OF THE INVENTION

Figure 3:
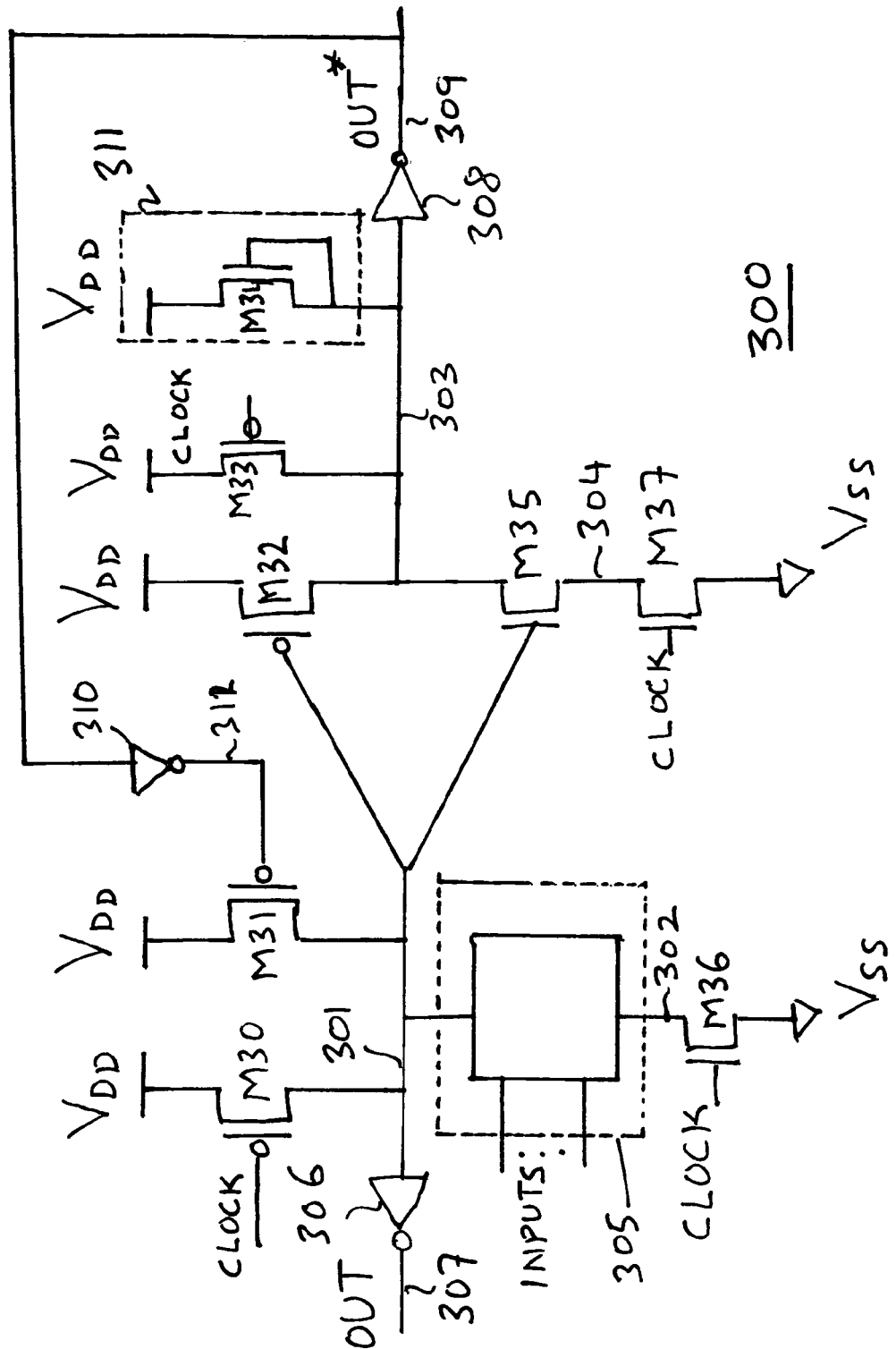
FIG. 3 depicts a schematic diagram of a precharge device constructed according to an embodiment of the disclosed invention.

FIG. 3 depicts a schematic diagram of a precharge device 300 constructed according to an embodiment of the present invention without cascode switching arrangement and with a glitch-reducing device 311 consisting of transistor M34. Precharge device 300 has a CLOCK and a transistor tree 305 where the tree 305 is connected between nodes 301 and 302 and may contain transistors in series or in parallel or series-parallel or parallel-series or any combination of these.

Precharge device 300 also has two clocking transistors M30 and M33, and two separate evaluate transistor M36 and M37 and a screening transistor M35. The gates of clocking transistors M30 and M33 and the two evaluate transistors M36 and M37 are connected to a periodic timing signal, CLOCK. The drains of clocking transistors M32 and M33 are connected to a voltage supply. V.sub.DD. The source of clocking transistor M30 is connected to node 301. The source of clocking transistor M33 is connected to node 303. Evaluate transistor M36 has its drain and source connected to node 302 and to V.sub.SS, ground, respectively. Evaluate transistor M37 has its drain and source connected to node 304 and to V.sub.SS, ground, respectively Screening transistor M35 has its gate connected to node 301, its first electrode is connected to node 303 and it's second connected to node 304.

In operation, precharge device 300 precharges nodes 301 and 303 to a known or predetermined voltage level when the input CLOCK is low. In the illustrated form, nodes 301 and 303 are precharged to V.sub.DD. The output from inverters 306 and 308 are therefore initially low. Transistor M35 causes a voltage drop between nodes 303 and 304 of V.sub.TH, one transistor threshold voltage. Node 304 is therefore initially at a voltage of (V.sub.DD–V.sub.TH). The evaluation stage is marked by CLOCK going to a high potential value.

Precharge device 300 may have two latching transistors M31 and M32, the M31 latching transistor prevents the node 301 from floating when there is no conductive path between 301 and node 302 during the evaluation stage and also assists in reducing the effects of any charge sharing or leakage during this time. This leads to a high logic on OUT node 307 through the inverter 306 connected to node 301. To reduce contention at node 301 when there is a conductive path between node 301 and 302 during the evaluation stage, M31 should not be immediately in the ON state otherwise M31 may try to pull the node 301 to V.sub.DD while simultaneously the node 301 is also being pulled to V.sub.SS resulting in increased power consumption as well as increased delay. In the preferred embodiment, the gate of M31 is connected to node 303 through two (or in general a delay element) inverters 308 and 310 to provide such minimal delay for M31 to turn ON. The glitch-reducing transistor M34 has it's drain connected to V.sub.DD, and it's source and gate is connected to the node 303 (other configurations for the glitch-reducing transistor are described in FIG. 7). When there is a conductive path between the node 301 and node 302 during the evaluation stage, the screening transistor M35 is in the ON state during this finite time (which depends on the delay associated with the transistor tree 305, evaluation transistors M36 and M37, screening transistor M35, capacitance on node 301) and with evaluation transistor M37 in the ON state during the evaluation stage, the voltage on the node 303 begins to be lowered while latching transistor M32 is still in the OFF state. During this critical time, the glitch-reducing transistor instantly aids in trying to keep the voltage on the node 303 from being lowered compared to a situation when the glitch-reducing transistor were absent (more detailed description in FIG. 9). As the voltage on the node 301 continues to be lowered, latching transistor M32 then pulls node 303 all the way to V.sub.DD while the screening transistor M35 also turns OFF.

The output of precharge device 300, node 309 also referred to as OUT*, is generated by the voltage at node 303 inverted and buffered by an inverter 308. An inverter 306 connected to node 301 generates the signal OUT also referred to as node 307. As depicted, all transistors in precharge device 300 are n-channel devices with the exception of clocking transistors M30 and M33 and latching transistors M31 and M32. Clocking transistors M30 and M33 and latching transistors M31 and M32 are p-channel devices. The evaluation transistor M36 may not be needed if the transistor tree 305 has all paths between the nodes 301 and 302 which at least have one input which is output from other domino stage(s).

Figure 4:
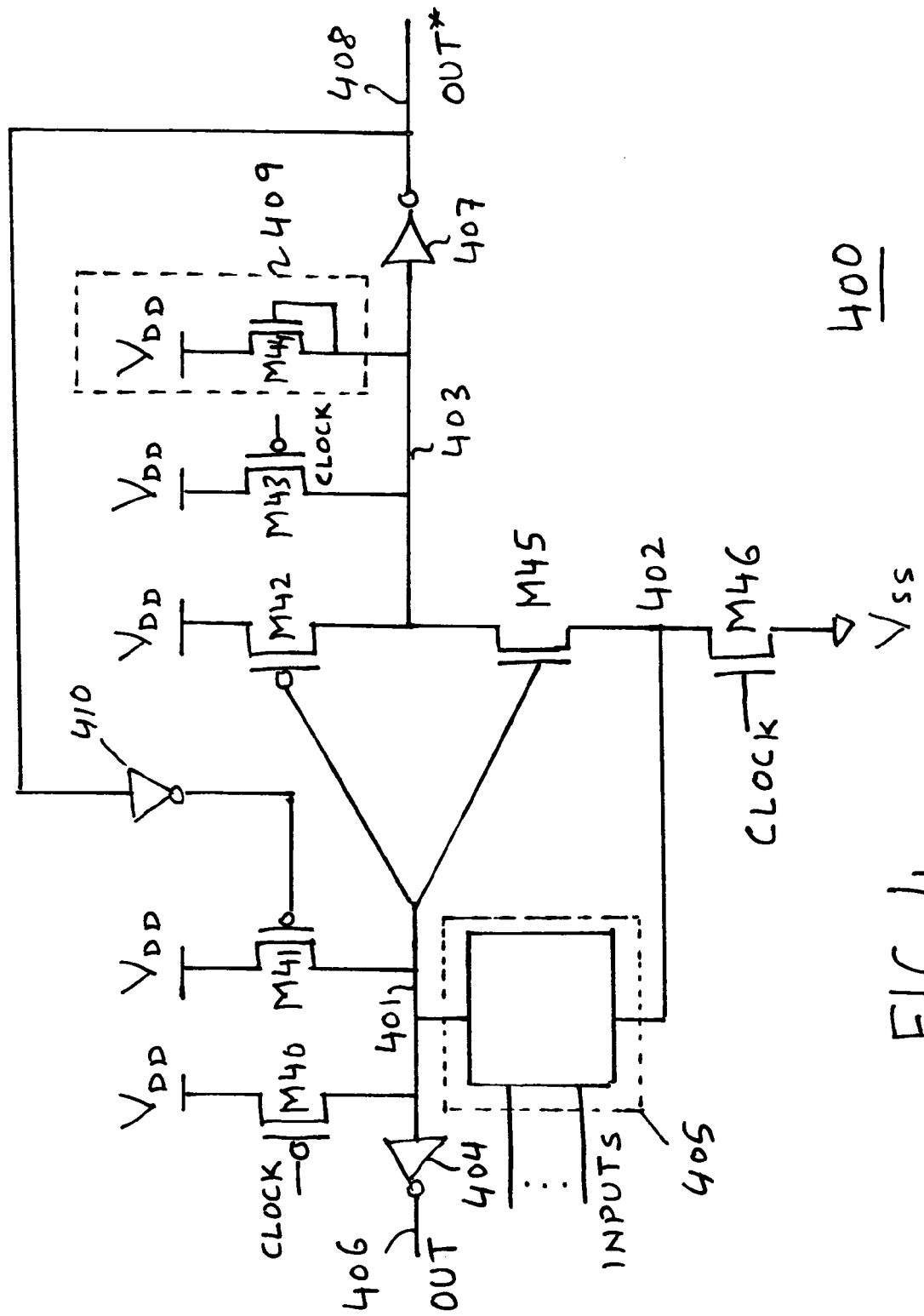
FIG. 4 depicts a schematic diagram of a precharge device constructed according to another embodiment of the disclosed invention.

FIG. 4 depicts a schematic diagram of a precharge device 300 constructed according to another embodiment of the present invention without cascode switching arrangement and with a glitch-reducing device 409 consisting of transistor M34, and a single evaluation transistor M46. Precharge device 400 has a CLOCK and a transistor tree 405 where the tree 405 is connected between nodes 401 and 402 and may contain transistors in series or in parallel or series-parallel or parallel-series or any combination of these.

Precharge device 400 also has two clocking transistors M40 and M43, and a single evaluate transistor M46 and a screening transistor M45. The gates of clocking transistors M40 and M43 and the single evaluate transistor M46 is connected to a periodic timing signal, CLOCK. The drains of clocking transistors M42 and M43 are connected to a voltage supply. $V_{DD}$. The source of clocking transistor M40 is connected to node 401. The source of clocking transistor M43 is connected to node 403. Evaluate transistor M46 has its drain and source connected to node 402 and to $V_{SS}$, ground, respectively. Screening transistor M45 has its gate connected to node 401, one of it's electrode connected to node 402 and second electrode connected to node 403.

In operation, precharge device 400 precharges nodes 401 and 403 to a known or predetermined voltage level when the input CLOCK is low. In the illustrated form, nodes 401 and 403 are precharged to $V_{DD}$. The output from inverters 406 and 407 are therefore initially low. Transistor M45 causes a voltage drop between nodes 403 and 402 of $V_{TH}$, one transistor threshold voltage. Node 402 is therefore initially at a voltage of ($V_{DD}-V_{TH}$). As the screening transistor is in the ON state during the precharge stage, node 402 may potentially also precharge some of the transistors in the transistor tree 405, and this may help in reducing the charge sharing effect on the node 401. The evaluation stage is marked by CLOCK going to a high potential value.

Precharge device 400 may have two latching transistors M41 and M42, the M41 latching transistor prevents the node 401 from floating when there is no conductive path between 401 and node 402 during the evaluation stage and also assists in reducing the effects of any charge sharing or leakage during this time. This leads to a high logic on OUT node 406 through the inverter 404 connected to node 401. To reduce contention at node 401 when there is a conductive path between node 401 and 402 during the evaluation stage, M41 should not be immediately in the ON state otherwise M41 may try to pull the node 401 to $V_{DD}$ while simultaneously the node 401 is also being pulled to $V_{SS}$ resulting in increased power consumption as well as increased delay. In the preferred embodiment, the gate of M41 is connected to node 403 through two (or in general a delay element) inverters 407 and 410 to provide such minimal delay for M41 to turn ON. The glitch-reducing transistor M44 has it's drain connected to $V_{DD}$, and it's source and gate is connected to the node 403 (other configurations for the glitch-reducing transistor are described in FIG. 7). When there is a conductive path between the node 401 and node 402 during the evaluation stage, the screening transistor M45 is in the ON state during this finite time (which depends on the delay associated with the transistor tree 405, evaluation transistor M46, screening transistor M45, capacitance on node 401) and with evaluation transistor M46 in the ON state during the evaluation stage, the voltage on the node 403 begins to be lowered while latching transistor M42 is still in the OFF state. During this critical time, the glitch-reducing transistor instantly aids in trying to keep the voltage on the node 403 from being lowered compared to a situation when the glitch-reducing transistor were absent (more detailed description in FIG. 9). As the voltage on the node 401 continues to be lowered, latching transistor M42 then pulls node 403 all the way to $V_{DD}$ while the screening transistor M45 also turns OFF.

The output of precharge device 400, node 408 also referred to as OUT*, is generated by the voltage at node 403 inverted and buffered by an inverter 407. An inverter 404 connected to node 401 generates the signal OUT also referred to as node 406. As depicted, all transistors in precharge device 400 are n-channel devices with the exception of clocking transistors M40 and M43 and latching transistors M41 and M42. Clocking transistors M40 and M43 and latching transistors M41 and M42 are p-channel devices.

Figure 5:
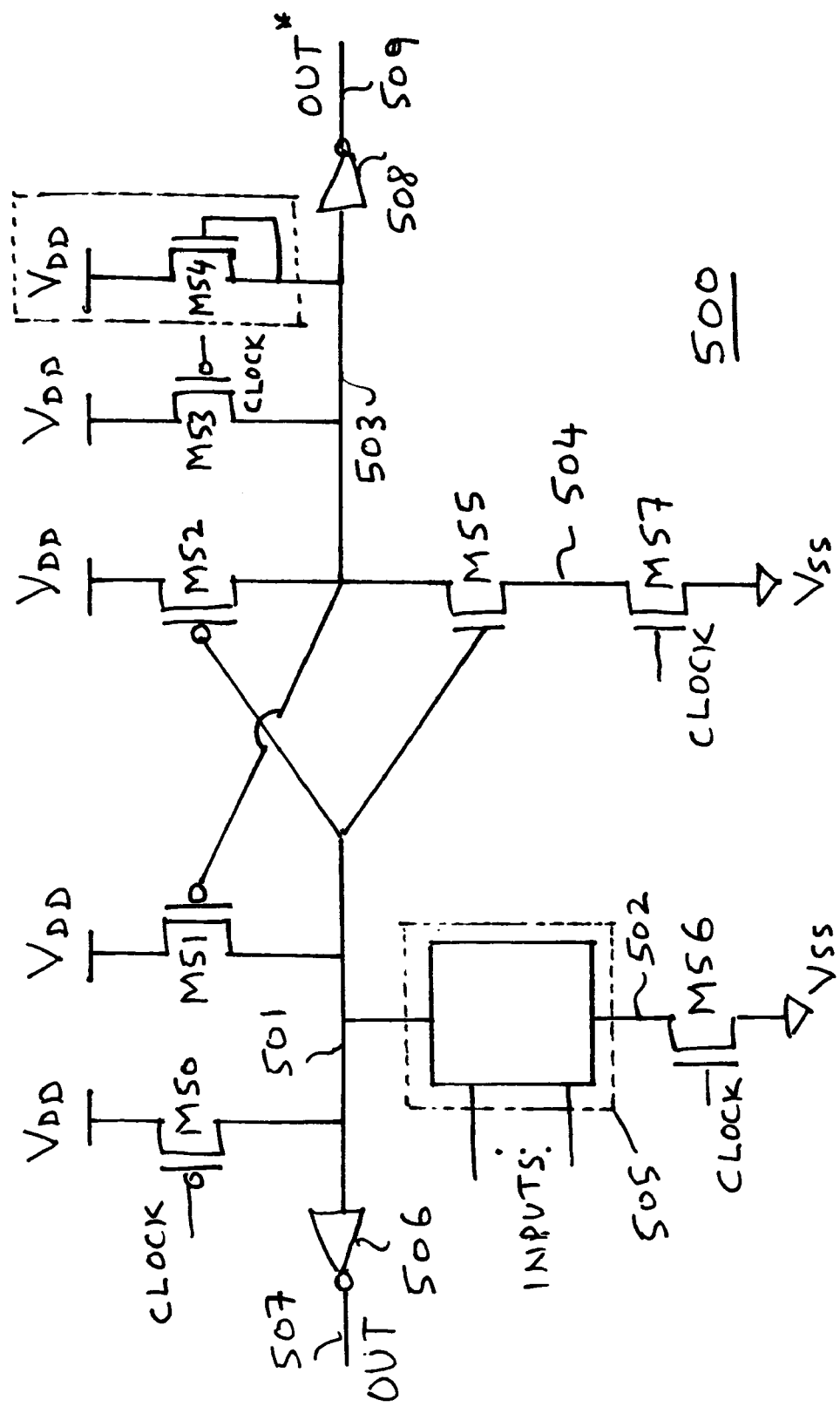
FIG. 5 depicts a schematic diagram of a precharge device constructed according to yet another embodiment of the disclosed invention.

FIG. 5 depicts a schematic diagram of a precharge device 500 constructed according to another embodiment of the present invention with cascode switching arrangement and with a glitch-reducing device 510 consisting of transistor M54. Precharge device 500 has a CLOCK and a transistor tree 505 where the tree 505 is connected between nodes 501 and 502 and may contain transistors in series or in parallel or series-parallel or parallel-series or any combination of these.

Precharge device 500 also has two clocking transistors M50 and M53, and two separate evaluate transistor M56 and M57 and a screening transistor M55. The gates of clocking transistors M50 and M53 and the two evaluate transistors M56 and M57 are connected to a periodic timing signal, CLOCK. The drains of clocking transistors M52 and M53 are connected to a voltage supply. $V_{DD}$. The source of clocking transistor M50 is connected to node 501. The source of clocking transistor M53 is connected to node 503. Evaluate transistor M56 has its drain and source connected to node 502 and to $V_{SS}$, ground, respectively. Evaluate transistor M57 has its drain and source connected to node 504 and to $V_{SS}$, ground, respectively Screening transistor M55 has its gate connected to node 501, its first electrode is connected to node 503 and it's second connected to node 504.

In operation, precharge device 500 precharges nodes 501 and 503 to a known or predetermined voltage level when the input CLOCK is low. In the illustrated form, nodes 501 and 503 are precharged to $V_{DD}$. The output from inverters 506 and 508 are therefore initially low. Transistor M55 causes a voltage drop between nodes 503 and 504 of $V_{TH}$, one transistor threshold voltage. Node 504 is therefore initially at a voltage of ($V_{DD}-V_{TH}$). The evaluation stage is marked by CLOCK going to a high potential value.

Precharge device 500 may have two latching transistors M51 and M52, the M51 latching transistor prevents the node 501 from floating when there is no conductive path between 501 and node 502 during the evaluation stage and also assists in reducing the effects of any charge sharing or leakage during this time. This leads to a high logic on OUT node 507 through the inverter 506 connected to node 501. In the preferred embodiment, the gate of M51 is connected to node 503 and this increases the capacitance on node 503 which may help in reducing the glitch on node 503 as discussed further. The glitch-reducing transistor M54 has it's drain connected to $V_{DD}$, and it's source and gate is connected to the node 503 (other configurations for the glitch-reducing transistor are described in FIG. 7). When there is a conductive path between the node 501 and node 502 during the evaluation stage, the screening transistor M55 is in the ON state during this finite time (which depends on the delay associated with the transistor tree 505, evaluation transistors M56 and M57, screening transistor M55, capacitance on node 501) and with evaluation transistor M57 in the ON state during the evaluation stage, the voltage on the node 503 begins to be lowered while latching transistor M52 is still in the OFF state. During this critical time, the glitch-reducing transistor instantly aids in trying to keep the voltage on the node 503 from being lowered compared to a situation when the glitch-reducing transistor were absent (more detailed description in FIG. 9).

As the voltage on the node 501 continues to be lowered, latching transistor M52 then pulls node 503 all the way to V.sub.DD while the screening transistor M55 also turns OFF.

The output of precharge device 500, node 509 also referred to as OUT*, is generated by the voltage at node 503 inverted and buffered by an inverter 508. An inverter 506 connected to node 501 generates the signal OUT also referred to as node 507. As depicted, all transistors in precharge device 500 are n-channel devices with the exception of clocking transistors M50 and M53 and latching transistors M51 and M52. Clocking transistors M50 and M53 and latching transistors M51 and M52 are p-channel devices. The evaluation transistor M56 may not be needed if the transistor tree 505 has all paths between the nodes 501 and 502 which at least have one input which is output from other domino stage(s).

Figure 6:
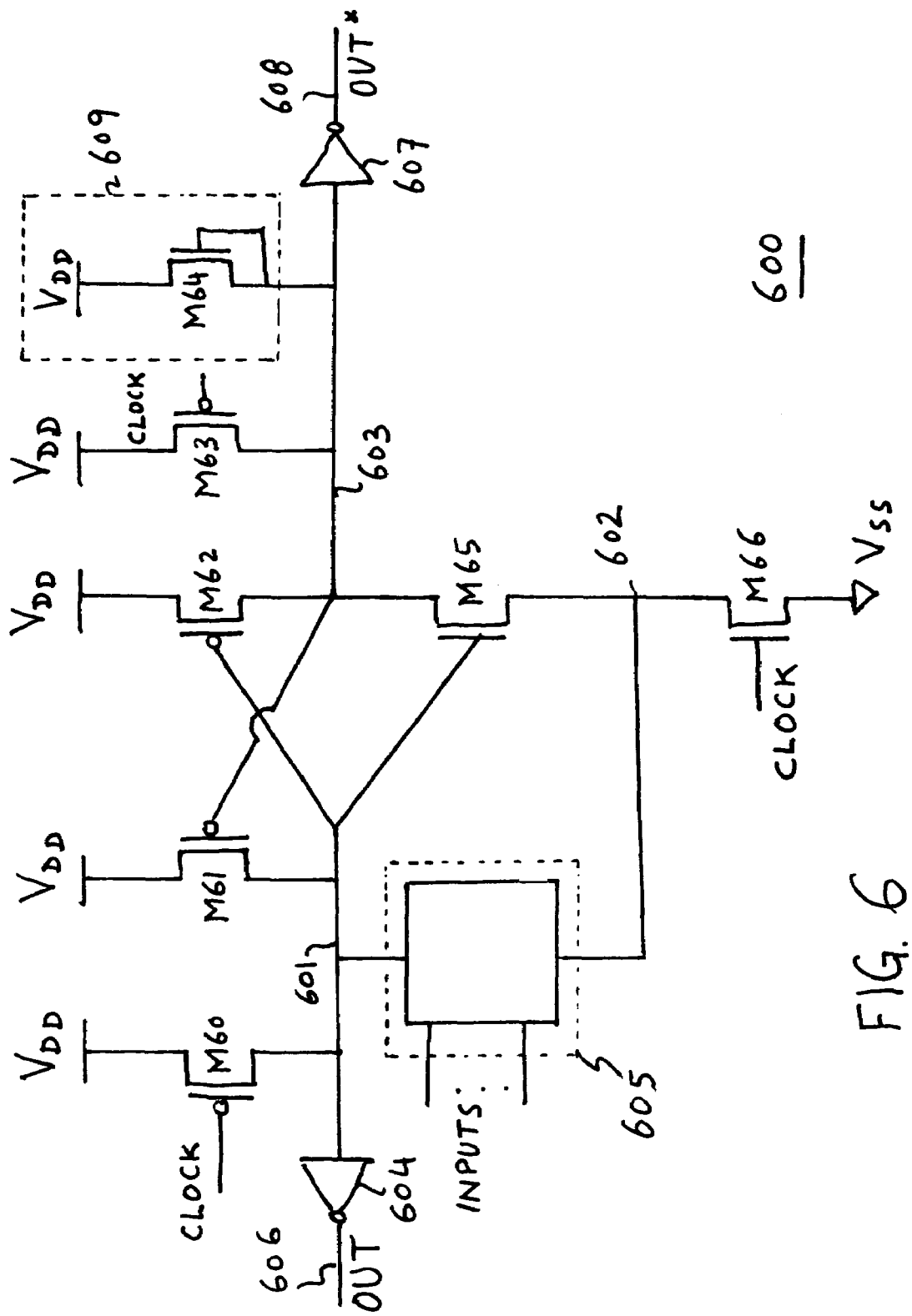
FIG. 6 depicts a schematic diagram of a precharge device constructed according to yet another embodiment of the disclosed invention.

FIG. 6 depicts a schematic diagram of a precharge device 600 constructed according to another embodiment of the present invention without cascode switching arrangement and with a glitch-reducing device 609 consisting of transistor M64 and a single evaluation transistor M66. Precharge device 600 has a CLOCK and a transistor tree 605 where the tree 605 is connected between nodes 601 and 602 and may contain transistors in series or in parallel or series-parallel or parallel-series or any combination of these.

Precharge device 600 also has two clocking transistors M60 and M63, and a single evaluate transistor M66 and a screening transistor M65. The gates of clocking transistors M60 and M63 and the single evaluate transistor M66 is connected to a periodic timing signal, CLOCK. The drains of clocking transistors M62 and M63 are connected to a voltage supply. V.sub.DD. The source of clocking transistor M60 is connected to node 601. The source of clocking transistor M63 is connected to node 603. Evaluate transistor M66 has its drain and source connected to node 602 and to V.sub.SS, ground, respectively. Screening transistor M65 has its gate connected to node 601, one of it's electrode connected to node 602 and second electrode connected to node 603.

In operation, precharge device 600 precharges nodes 601 and 603 to a known or predetermined voltage level when the input CLOCK is low. In the illustrated form, nodes 601 and 603 are precharged to V.sub.DD. The output from inverters 606 and 607 are therefore initially low. Transistor M65 causes a voltage drop between nodes 603 and 602 of V.sub.TH, one transistor threshold voltage. Node 602 is therefore initially at a voltage of (V.sub.DD−V.sub.TH). As the screening transistor is in the ON state during the precharge stage, node 602 may potentially also precharge some of the transistors in the transistor tree 605, and this may help in reducing the charge sharing effect on the node 601. The evaluation stage is marked by CLOCK going to a high potential value.

Precharge device 600 may have two latching transistors M61 and M62, the M61 latching transistor prevents the node 601 from floating when there is no conductive path between 601 and node 602 during the evaluation stage and also assists in reducing the effects of any charge sharing or leakage during this time. This leads to a high logic on OUT node 606 through the inverter 604 connected to node 601.

In the preferred embodiment, the gate of M61 is connected to node 603 thereby increasing the capacitance on the node 603 which may assist in reducing the glitch on the node 603. The glitch-reducing transistor M64 has it's drain connected to V.sub.DD, and it's source and gate is connected to the node 603 (other configurations for the glitch-reducing transistor are described in FIG. 7). When there is a conductive path between the node 601 and node 602 during the evaluation stage, the screening transistor M65 is in the ON state during this finite time (which depends on the delay associated with the transistor tree 605, evaluation transistor M66, screening transistor M65, capacitance on node 601) and with evaluation transistor M66 in the ON state during the evaluation stage, the voltage on the node 603 begins to be lowered while latching transistor M62 is still in the OFF state. During this critical time, the glitch-reducing transistor instantly aids in trying to keep the voltage on the node 603 from being lowered compared to a situation when the glitch-reducing transistor were absent (more detailed description in FIG. 9). As the voltage on the node 601 continues to be lowered, latching transistor M62 then pulls node 603 all the way to V.sub.DD while the screening transistor M65 also turns OFF.

The output of precharge device 600, node 608 also referred to as OUT*, is generated by the voltage at node 603 inverted and buffered by an inverter 607. An inverter 604 connected to node 601 generates the signal OUT also referred to as node 606. As depicted, all transistors in precharge device 600 are n-channel devices with the exception of clocking transistors M60 and M63 and latching transistors M61 and M62. Clocking transistors M60 and M63 and latching transistors M61 and M62 are p-channel devices.

Figure 7:
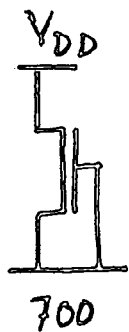
FIG. 7 depicts a partial schematic diagram of a glitch-reducing transistor which is incorporated in various embodiments of the invention depicted in FIG. 3 to FIG. 6.
Figure 7:
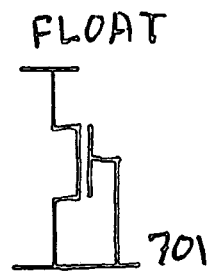
Figure 7:
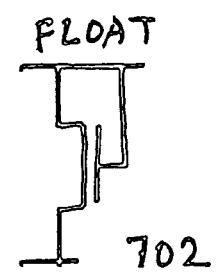
Figure 7:
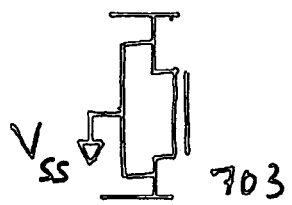
Figure 7:
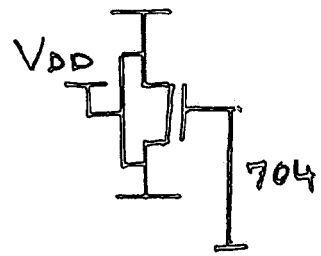
Figure 7:
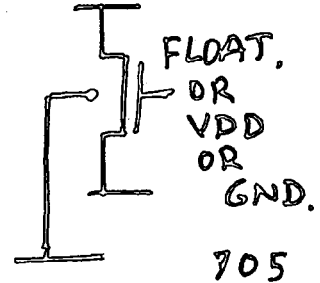
Figure 7:
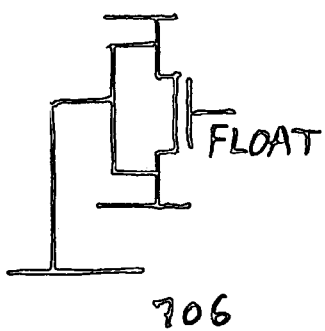
Figure 7:
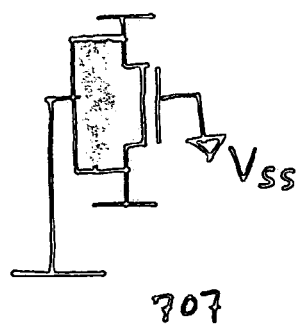
Figure 7:
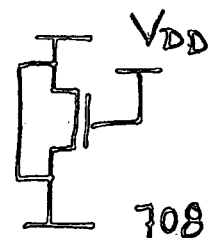

FIG. 7 depicts more configurations in which the glitch-reducing device 311 of FIG. 3 or 409 of FIG. 4 or of 510 FIG. 5 or 609 FIG. 6 may be represented. More multiple configurations may be represented for the glitch-reducing device by those skilled in the art. Any one of these configurations may replace the glitch-reducing device in FIGS. 3, 4, 5 and 6 with the node labeled 700 connected to the node 303 of FIG. 3 or the node 403 of FIG. 4 or the node 503 of FIG. 5 or the node 603 of FIG. 6

Figure 8:
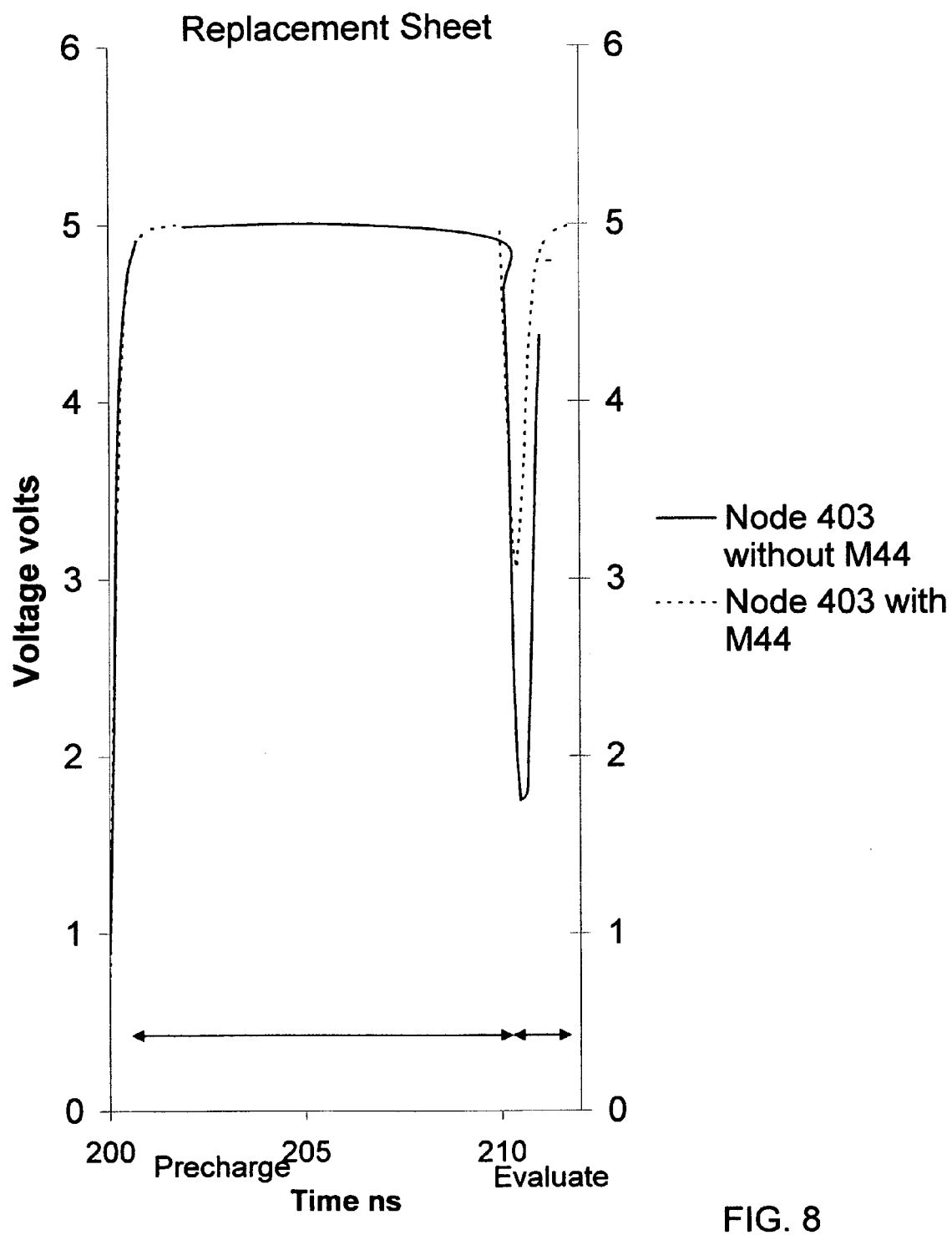
FIG. 8 depicts a timing diagram in graphical form of the precharge device depicted in FIG. 4.

FIG. 8 depicts the voltages at node 403 of FIG. 4 with or without glitch-reducing transistor M44. FIG. 8 is divided into two parts named after and corresponding to the two states of precharge device 28, precharge and evaluate. In the depicted embodiment of FIG. 4, the precharge and evaluate states correspond to a low and a high voltage on CLOCK, respectively. It will be noted that Node 403 of FIG. 4 has a much smaller glitch when glitch-controlling transistor M44 of FIG. 4 is present compared to when it is absent. The glitch-reducing transistor M44 assists in minimizing the glitch at such critical time interval when node 401 of FIG. 4 is taking finite time to discharge, without adding contention to node 403 of FIG. 4 and thus not increasing the delay or power consumption of circuit 400 of FIG. 4. As the glitch-reducing transistor M44 of FIG. 4 is assisting, M45 of FIG. 4 after the finite discharge time turns off and M42 of FIG. 4 turns on to restore node 403 of FIG. 4 all the way to V.sub.DD under the conditions when transistor tree 405 of FIG. 4 has a conductive path to V.sub.SS, ground and takes a finite time to discharge node 401 of FIG. 4 to V.sub.SS, ground. This trend also applies to node 303 of FIG. 3, node 503 of FIG. 5 and node 603 of FIG. 6.

Figure 9:
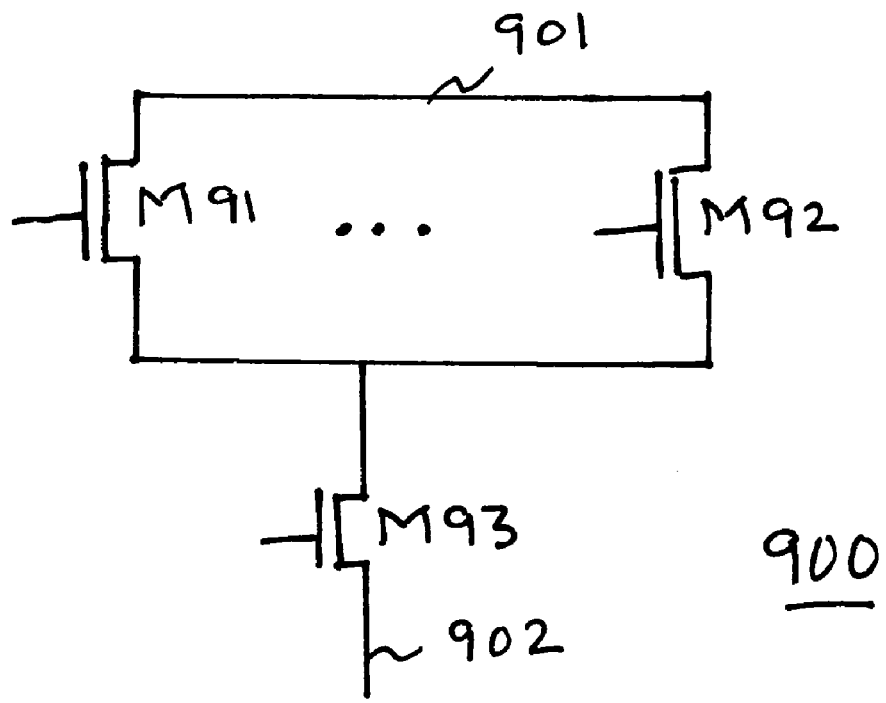
FIG. 9 depicts a partial schematic diagram of a transistor tree for bulk-CMOS which is incorporated in various embodiments of the invention depicted in FIG. 3 to FIG. 6.

FIG. 9 depicts the transistor tree 900 corresponding to 305 of FIG. 3 or 405 of FIG. 4 or 505 of FIG. 5 or 605 of FIG. 6 for bulk-CMOS where the node 901 corresponds to the node 301 of FIG. 3 or 401 of FIG. 4 or 501 of FIG. 5 or 601 of FIG. 6 and the node 902 of FIG. 9 corresponds to the node 302 of FIG. 3 or the node 402 of FIG. 4 or the node 502 of FIG. 5 or 602 of FIG. 6. The transistor tree 900 consists of a maximum of one parallel transistor network coupled to the node 901. It is suited for bulk-CMOS and may be used even if only one output, namely 307 of FIG. 3 or 406, OUT in FIG. 4 or 507 of FIG. 5 or 606, OUT in FIG. 6 corresponding may be the only output of the domino circuit.

If the transistor network within the tree does not have high leakage, then this permits a larger capacitance on the node 301 of FIG. 3 or the node 401 of FIG. 4 or 501 of FIG. 5 or 601 of FIG. 6, there allowing larger precharge available to share with the nodes of the transistor tree during evaluation stage when there is no conductive path between the nodes 301 and 302 in FIG. 3 or the nodes 401 and 402 of FIG. 4 or the nodes 501 and 502 in FIG. 5 or the nodes 601 and 602 of FIG. 6, thereby reducing the effect of charge sharing.

Figure 11:
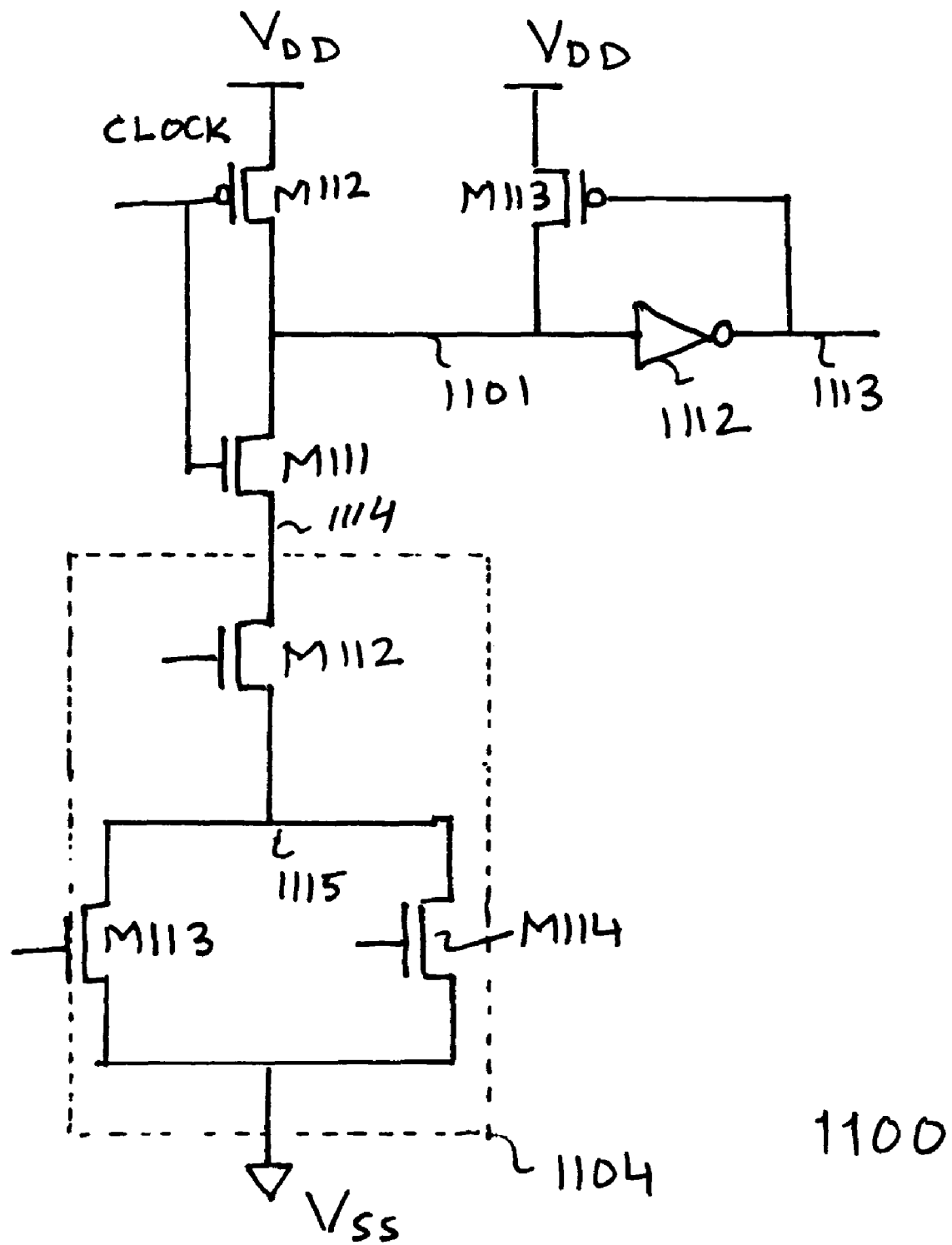
FIG. 11 depicts a schematic diagram with a transistor tree for SOI which is incorporated in a single output domino logic circuit.

Further, the transistor tree of FIG. 9 is also suited for bulk-CMOS corresponding to FIG. 11 for single output domino logic circuit In such case, evaluation transistor M111 of FIG. 11 for bulk-CMOS may instead be coupled between 902 and the second known potential. The node 901 is coupled to the node 1101 of FIG. 11 for bulk-CMOS. Consider a transistor tree represented by a Boolean expression, O=a*b+a*c+a*d where a, b, c and d are control electrodes to transistor(s) M91 . . . M92, M93, etc. and O is the result of the expression and '*' represents AND and '+' represents OR. The common term is 'a' either picked graphically or by factoring this boolean expression and may be represented in an equivalent form by picking the largest term after factoring:

$$O=(b+a+d)*a;$$

This then represents the transistor tree of FIG. 9 for bulk-CMOS with the largest parallel part of the transistor tree is represented by b+a+d and M93 represents 'a'.

Figure 10:
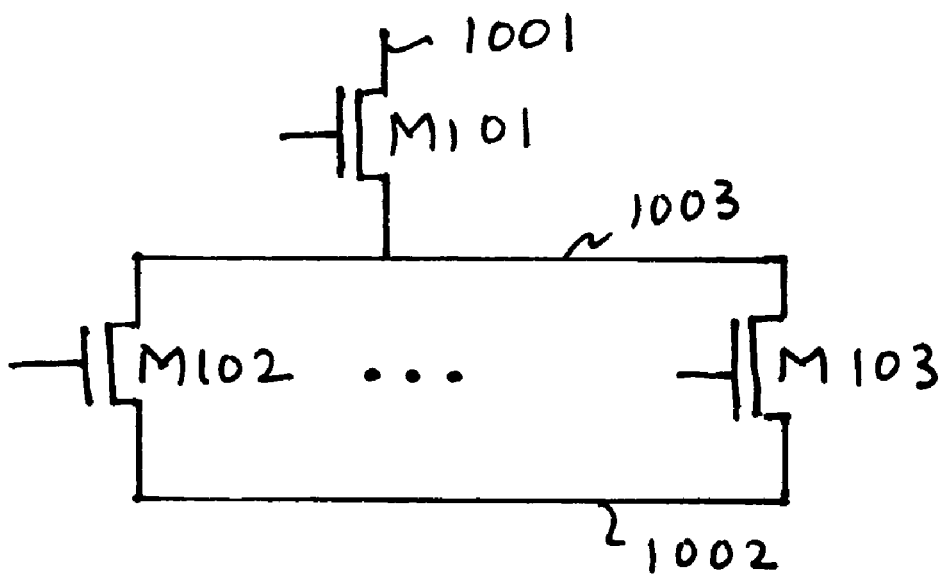
FIG. 10 depicts a partial schematic diagram of a transistor tree for SOI which is incorporated in various embodiments of the invention depicted in FIG. 3, FIG. 5 and FIG. 11.

This transistor tree arrangement of FIG. 10 is suited for strained or unstrained Silicon-On-Insulator (SOI) when output and/or complementary output are generated, namely 307, OUT and/or 309, OUT* in FIG. 3 (or 507, OUT and/or 509 in FIG.5). Herein the drain of the evaluation transistor M101 corresponding to M36 of FIG. 3 or M56 of FIG. 5 is connected to node 301 of FIG. 3 (or node 501 of FIG. 5) and it's source is connected to the drain end of the transistor tree instead of the evaluation transistor M36 of FIG. 3 (or M56 of FIG. 5). The gate of the evaluation transistor M101 is connected to the CLOCK and the transistor tree may have zero or more series connected transistors on the drain end of the transistor tree and/or one parallel transistor network on the source end of the transistor tree which is connected to the second known potential for each and every path from the drain end of the transistor tree to the source end of the transistor tree which is coupled to the second known potential. The evaluate transistor M101 ensures that the transistor tree is not precharged during the precharge stage, thereby eliminating the chance of any parasitic bipolar effects. The evaluate transistor M101 being absent if each and every path from the drain end of the transistor tree to the source end of the transistor tree, the transistors in such path(s) have at least one control electrode of the transistor in such path(s) which is coupled to output from other precharge device(s).

FIG. 11 describes a precharge device for strained or unstrained Silicon-On-Insulator (SOI) where the insulator may be oxide or nitride or carbide of a combination of these and the like or Sapphire and the like and comprises of a first node, 1101 and a second node, 1114; and a transistor tree, 1104 operable to electrically short-circuit the second node, 1114 to the second known voltage level responsive to input signals; wherein the transistor tree comprising of a series-connected transistor network of zero or more transistors, e.g. M112 coupled between the second node and the first terminal, 1115 of a two-terminal parallel-connected transistor network wherein the second terminal of the parallel-connected transistor is coupled to the second known voltage level for each and every path from the second node to the second known voltage level wherein the parallel-connected transistor network, M113 . . . M114 may be the largest possible while maintaining the equivalent boolean function for the precharge device; and an optional keeper transistor, M113 comprising a first and a second control electrode and a control electrode, the first current electrode coupled to the first known voltage level, the second current electrode coupled to the first node, 1101 and the control electrode is coupled the output of an inverting buffer, 1113 wherein the inverting buffer input is coupled to the first node, 1101; and a clocking transistor, M112 comprising a first and a second current electrode and a control electrode, the first current electrode coupled to the first known voltage level, the second current electrode coupled to the first node, 1101 and the control electrode coupled to the periodic clocking signal and an evaluate transistor, M111 comprising a first and a second current electrode and a control electrode, with the first current electrode coupled to the first node, 1101 and the current second node is coupled to the second node, 1114 and the control electrode is coupled to the periodic clock signal, wherein the evaluate transistor being absent if each and every path from the second node to the second known voltage level through the transistor tree has at least one control electrode of the transistor in said path(s) which is coupled to output from other precharge device(s) and clocking circuitry for precharging the first node, 1101 to a first known voltage level during a first phase of a periodic clocking signal and for coupling the first node to the second node and evaluating the voltage on the first node to provide an output logic signal during a second phase of the periodic clocking signal responsive to input signals to the transistor tree potentially short-circuiting first and second node to the second known voltage level.

Further, the transistor tree arrangement of FIG. 11 is also suited for strained or unstrained Silicon-On-Insulator (SOI) even if only one output, namely 307, OUT in FIG. 3 (or 507, OUT in FIG. 5). Herein the drain of the evaluation transistor M111 corresponds to M36 of FIG. 3 or M56 of FIG. 5 is connected to node 301 of FIG. 3 (or node 501 of FIG. 5) and it's source is connected to the drain end of the transistor tree. The evaluation transistor M36 of FIG. 3 (or M56 of FIG. 5) is replaced with equivalent M111 similar to FIG. 11 in FIG. 3 and FIG. 5 The gate of the evaluation transistor M111 is connected to the CLOCK and the transistor tree may have zero or more series connected transistors on the drain end of the transistor tree and/or one parallel transistor network on the source end of the transistor tree which is connected to the second known potential for each and every path from the drain end of the transistor tree to the source end of the transistor tree which is coupled to the second known potential. The evaluate transistor M111 ensures that the transistor tree is not precharged during the precharge stage, thereby eliminating the chance of any parasitic bipolar effects. The evaluate transistor M111 being absent if each and every path from the drain end of the transistor tree to the source end of the transistor tree, the transistors in such path(s) have at least one control electrode of the transistor in said path(s) which is coupled to output from other precharge device(s). Consider a transistor tree represented by an expression, O=a*b+a*c+a*d where a, b, c and d are control electrodes to transistor(s) M101 . . . M102, M103, etc. corresponding to FIG. 10 or M112 . . . M114, etc. corresponding to FIG. 11 and O is the result of the expression and '*' represents AND and '+' represents OR. The common term is 'a' either picked graphically or by factoring this expression and may be represented in an equivalent form by picking the largest term after factoring:

$$O=a*(b+a+d);$$

This then represents the transistor tree of FIG. 10 or FIG. 11 for unstrained/strained SOI with the largest parallel part of the transistor tree is represented by b+a+d e.g. M102 . . .

M103 of FIG. 10 or M113 ... M114 of FIG. 11 while M101 of FIG. 10 represents 'a' or M112 represents 'a' in FIG. 11.

The input logic may be synthesized by a process of technology mapping of the input logic circuit into domino logic circuit output where the user may specify the blocks to be converted to domino logic or by determining the critical paths and converting the logic in the critical path to domino logic. Prior art single output domino logic requires that the input logic not contain inverting logic which occurs from circuit components such as inverters, NAND gates, and NOR gates. Further, removal of trapped inverters may require logic duplication as taught in U.S. Pat. No. 5,903,467 issued to Puri et. al on May 11, 1999. The present invention also teaches methods of synthesis where logic duplication is not needed as such blocks may be converted to domino logic where output and/or complementary output is available, thereby considerably saving in delay, power consumption, area, glitch size and the like.

Figure 1:
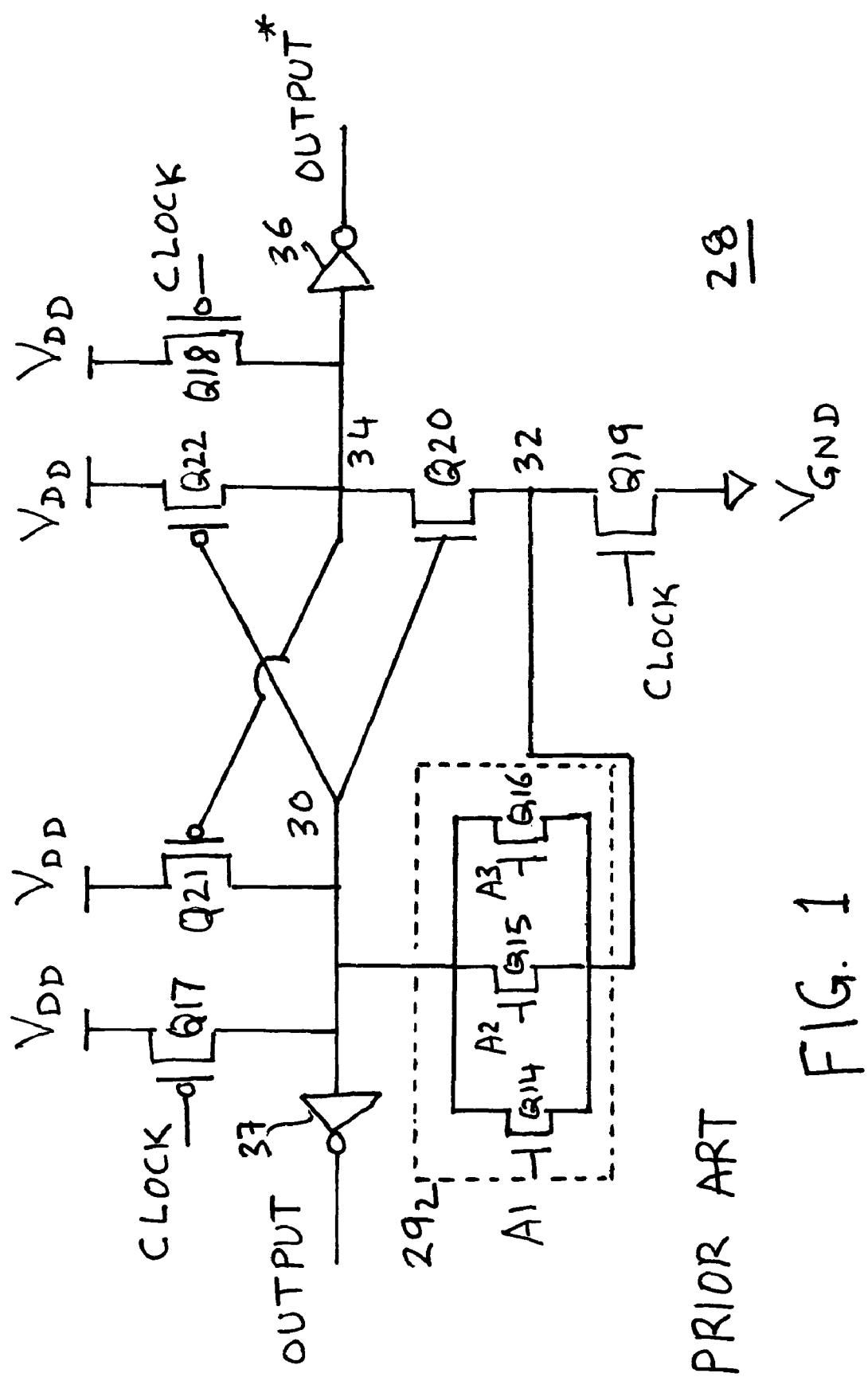
FIG. 1 depicts a schematic diagram of a prior art implemented with output and complementary output with potential of a glitch.
Figure 2:
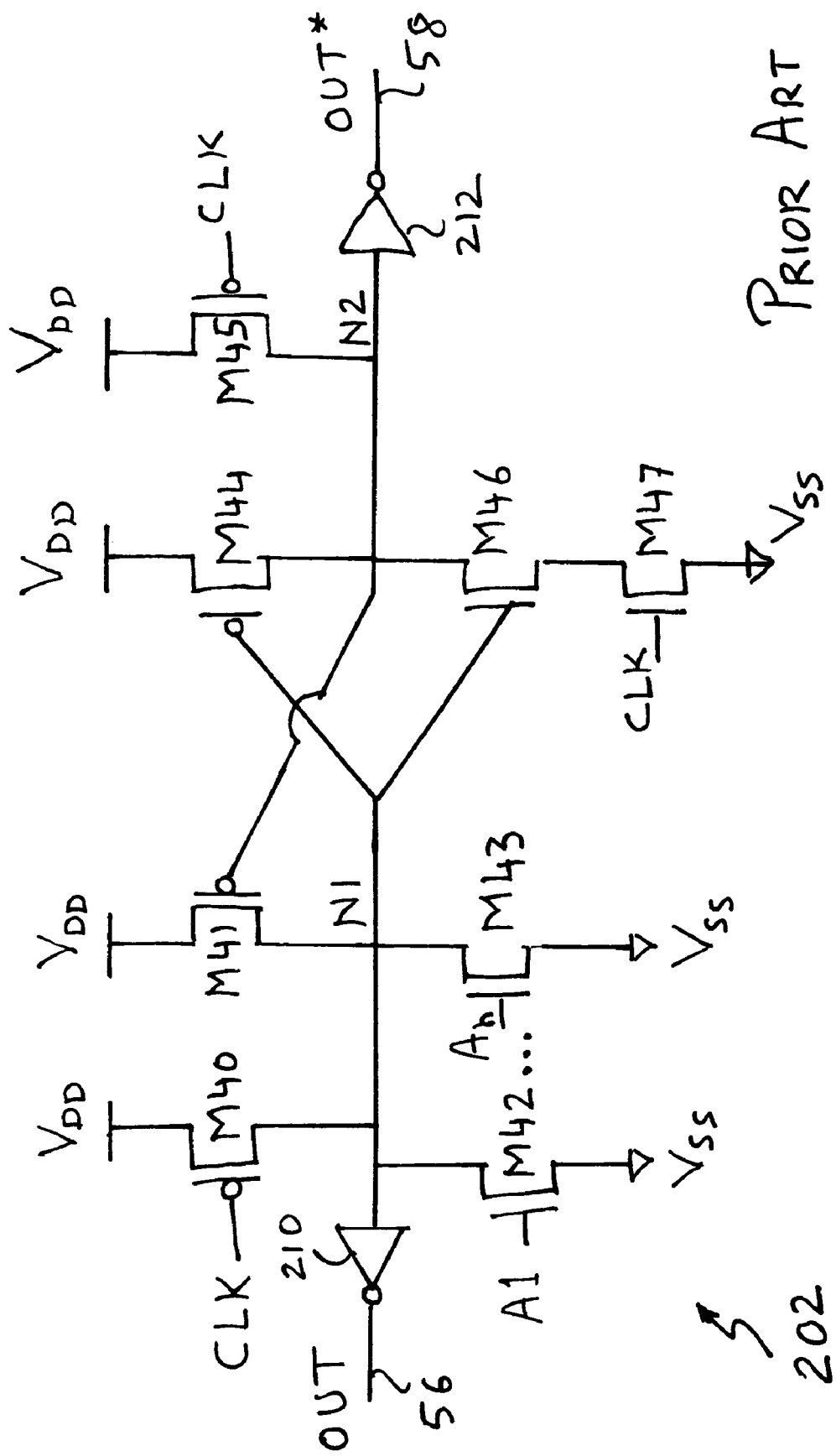
FIG. 2 depicts a schematic diagram of a prior art implemented with output and complementary output with potential of a glitch.

The Register Level Language (RTL) such Verilog may be parsed and partitioned to blocks of user-specified (or based on delay related data for a given process technology such as CMOS or SOI and the like) fan-in and/or maximum series connected transistor tree of FIGS. 3-11; or The Register Level Language (RTL) such Verilog may be parsed and mapped to blocks of user-specified (or based on delay related data for a given process technology such as CMOS or SOI and the like a library of cells e.g. .lib format and the like) fan-in and/or maximum series connected transistor tree of FIGS. 3-11; or Previously designed gates or equivalent logic description is collected into blocks subject to user-specified (or based on delay related data for a given process technology such as CMOS or SOI and the like with a library of cells e.g. .lib format and the like) fan-in or maximum series connected transistor tree) of FIGS. 3-11; and In an embodiment of synthesis an input and/or output phase assignment is conducted to convert each block into non-inverting logic, with the option of considering the power consumption as being proportional to signal probability p and if a block is transformed by DeMorgan's theorem, new signal probability is 1−p but the trapped inverters are not removed while removing the pairs of inverters in series with one another. The domino logic circuit is created where the domino single output non-inverting blocks are created for non-inverting blocks as of prior art domino logic. See, e.g., R. H. Krambeck, et al., "High-Speed Compact Circuits with CMOS," IEEE Journal of Solid-State Circuits (June, 1982) SC-17(3):614-619 and the like along with improvements mentioned in FIGS. 9-11, and for blocks requiring both domino output polarities or only inverting output are implemented as in FIGS. 3-10 which implement output and/or complementary or other forms of dual output domino logic of FIGS. 1 or 2 and the like, thereby eliminating the need of logic duplication.

Further, the synthesis requires removing pairs of inverters in series with one another and creating non-inverting domino circuit for non-inverting only nodes and creating inverting domino circuit for inverting only nodes and creating precharge circuit with both inverting and non-inverting outputs where both inverting and non-inverting outputs are required for the node(s) and computing a signal probability at each node of the circuit which is proportional to power consumption and evaluating a power consumption for each circuit and choosing the circuit which results in an optimal combination of low power consumption of the circuit and/or with a delay time which is less than or equal to a predetermined delay time and/or low total transistor count and/or glitch severity and/or leakage and the like among said combinations.

In another embodiment of synthesis an input and/or output phase assignment is not conducted to convert each block into non-inverting logic rather the domino logic circuit is created where some blocks may have non-inverting domino output blocks only as of prior art domino logic. See, e.g., R. H. Krambeck, et al., "High-Speed Compact Circuits with CMOS," IEEE Journal of Solid-State Circuits (June, 1982) SC-17(3):614-619 and the like along with improvements mentioned in FIGS. 9-11, while other blocks requiring only inverting output and/or both domino output polarities are implemented as in FIGS. 3-10 which implement output and/or complementary or other forms of dual output domino logic of FIGS. 1 or 2 and the like, with the option of considering the power consumption as being proportional to signal probability p and if a block is transformed by DeMorgan's theorem, new signal probability is 1−p while removing the pairs of inverters in series with one another.

Further, the synthesis requires removing pairs of inverters in series with one another and creating non-inverting domino circuit for non-inverting only nodes and creating inverting domino circuit for inverting only nodes and creating precharge circuit with both inverting and non-inverting outputs where both inverting and non-inverting outputs are required for the node(s) and computing a signal probability at each node of the circuit which is proportional to power consumption and evaluating a power consumption for each circuit and choosing the circuit which results in an optimal combination of low power consumption of the circuit and/or with a delay time which is less than or equal to a predetermined delay time and/or low total transistor count and/or glitch severity and/or leakage and the like among said combinations.

Although the present invention has been described with reference to a specific embodiment, further modifications and improvements will occur to those skilled in the art. For instance, the transistors may be implemented either as n-channel or p-channel devices as desired. These substitutions, and the requisite changes caused by them, will be obvious to one skilled in the art. It is to be understood therefore, that the invention encompasses all such modifications that do not depart from the spirit and scope of the invention as defined in the appended claims. Also, the designation of portions of the various transistors described above as "drain" or "source" is merely semantic given the bidirectional nature of CMOS circuits and is arbitrary given the other semiconductor media in which the disclosed invention may be practiced. These media include any material that provides three terminal switches (excluding bulk electrode) such as gallium arsenide, Bipolar, ECL, NMOS, strained or unstrained Silicon-On-Insulator (SOI) where the insulator may be oxide or nitride or carbide of a combination of these or Sapphire and BiCMOS. The claims therefore will describe the drain, source, and gate generically as a first current electrode, a second current electrode and a control electrode, respectively.

There may be intermediate structure (such as a buffer) or signals between two illustrated structures or within a structure (such as a conductor) that is illustrated as being continuous. The borders of the boxes in the figures are for illustrative purposes and not intended to be restrictive.

If the specification states a component, feature, structure, or characteristic "may", "might", or "could" be included, that particular component, feature, structure, or characteristic is not required to be included. Reference in the specification to "some embodiments" means that a particular feature, structure, or characteristic described in connection with the embodiments is included in at least some embodiments, but not necessarily all embodiments, of the invention. The various appearances "some embodiments" are not necessarily all referring to the same embodiments.

The various embodiments have described the periodic clock signal as being low or high during precharge, depending on the example. However, the logic could be changed so that periodic clock signal is in the opposite state during the precharge phase. A corresponding source follower configuration is another example. Additional keeper transistors may be included in various circuits.

The various transistors may be sized as desired and the timing signals may be adjusted to achieve desired results with a compromise between delay, power consumption, area, glitch size, leakage and the like. The transistors may be forward biased, zero biased, or reverse biased, and different transistors may have different biases and/or different threshold voltages due to gate to body connections with voltages below the forward-bias voltage of Silicon and the like and/or different threshold voltages as a result of selective implant and the timing signals may be adjusted to achieve desired results with a compromise between delay, power consumption, area, glitch size, leakage and the like Those skilled in the art having the benefit of this disclosure will appreciate that many other variations from the foregoing description and drawings may be made within the scope of the present invention. Accordingly, it is the claims including any amendments thereto that define the scope of the invention.

What is claimed is:

1. A precharge device comprising:
a first node 301 and a second node 302;
a series-parallel network of transistors 305 operable to electrically short-circuit the first and the second nodes together responsive to input signals;
a NAND gate coupled to receive the first node and a clock signal and output signal to a third node 303; and
a first clocking transistor M30 comprising a first and a second current electrode and a control electrode, the first current electrode coupled to the first known voltage level, the second current electrode coupled to the first node and the control electrode coupled to the clock signal; and
an evaluate transistor M36 comprising a first and a second current electrode and a control electrode, the first current electrode coupled to the second node, the second current electrode coupled to a second known voltage level and the control electrode coupled to the clock signal; and
a stabilizing element M34 coupled to the third node to minimize erroneous functionality, loss of precharge, noise susceptibility and glitch; and
clocking, circuitry for precharging the first and third nodes to the first known voltage level during a first phase of the clocking signal and for coupling the second node to the second known voltage level and evaluating the voltage on the first node as input to a first inverter to provide an output logic signal and evaluating the voltage on the third node as input to a second inverter to provide an inverted output logic signal during a second phase of the clock signal; and
a first latching transistor M31 comprising a first and a second current electrode and a control electrode, the first current electrode coupled to a first known voltage level, the second current electrode coupled to the first node and the inverted output logic signal as input to a third inverter is coupled to the control electrode.

2. A precharge device of claim 1 wherein the NAND gate comprising of:
two pull-up transistors M32 and M33 coupled in parallel to the third node; and two pull-down transistor M35 and M37 connected in series at a common node 304 and;
the common node 304 is coupled to the second node; and the evaluate transistor M36 is absent.

3. A precharge device comprising:
a first node 501 and a second node 502;
a series-parallel network of transistors 505 operable to electrically short-circuit the first and the second nodes together responsive to input signals;
a NAND gate coupled to receive the first node and a clock signal and output signal to a third node 503; and
a first latching transistor M51 comprising a first and a second current electrode and a control electrode, the first current electrode coupled to a first known voltage level, the second current electrode coupled to the first node and the control electrode coupled to the third node; and
a first clocking transistor M50 comprising a first and a second current electrode and a control electrode, the first current electrode coupled to the first known voltage level, the second current electrode coupled to the first node and the control electrode coupled to the clock signal; and
an evaluate transistor M56 comprising a first and a second current electrode and a control electrode, the first current electrode coupled to the second node, the second current electrode coupled to a second known voltage level and the control electrode coupled to the clock signal; and
a stabilizing element M54 coupled to the third node to minimize erroneous functionality, loss of precharge, noise susceptibility and glitch; and
clocking circuitry for precharging the first and third nodes to the first known voltage level during a first phase of the clocking signal and for coupling the second node to the second known voltage level and evaluating the voltage on the first node to as input to a first inverter to provide an output logic signal and evaluating the voltage on the third node as input to a second inverter to provide an inverted output logic signal during a second phase of the clock signal.

4. A precharge device of claim 3 wherein the NAND gate comprising of:
two pull-up transistors M52 and M53 coupled in parallel to the third node; and two pull-down transistor M55 and M57 connected in series at a common node 504 and;
the common node 504 is coupled to the second node; and the evaluate transistor M56 is absent.

5. The precharge device of claim 1 or 3 wherein the stabilizing element comprising of:
a transistor comprising a first and a second current electrode and a control electrode, the first current electrode coupled to the first known voltage level, the second current electrode coupled to the third node and the control electrode coupled to the third node.

6. The precharge device of claim 1 or 3 wherein the stabilizing element comprising of:
a transistor comprising a first and a second current electrode and a control electrode, the first current electrode is unconnected, the second current electrode coupled to the third node and the control electrode coupled to the third node.

7. The precharge device of claim 1 or 3 wherein the stabilizing element comprising of:
a transistor comprising a first and a second current electrode and a control electrode, the first current electrode coupled is unconnected, the second current electrode coupled to the third node and the control electrode is unconnected.

8. The precharge device of claim 1 or 3 wherein the stabilizing element comprising of:
a transistor comprising a first and a second current electrode and a control electrode, the first current electrode coupled to the second known voltage level, the second current electrode coupled to the second known voltage level and to the third node, and the control electrode is floating.

9. The precharge device of claim 1 or 3 wherein the stabilizing element comprising of:
a transistor comprising a first and a second current electrode and a control electrode, the first current electrode coupled to the first known voltage level, the second current electrode coupled to the first known potential and the control electrode coupled to the third node.

10. The precharge device of claim 1 or 3 wherein the stabilizing element comprising of:
a transistor comprising a first and a second current electrode and a control electrode, the first current electrode is unconnected, the second current is unconnected and the control electrode coupled is unconnected and the bulk node is connected to the third node.

11. The precharge device of claim 1 or 3 wherein the stabilizing element comprising of:
a transistor comprising a first and a second current electrode and a control electrode, the first current electrode coupled to the third node, the second current is coupled to the third node and the control electrode is unconnected.

12. The precharge device of claim 1 or 3 wherein the stabilizing element comprising of:
a transistor comprising a first and a second current electrode and a control electrode, the first current electrode coupled to the third node, the second current electrode coupled to the third node and the control electrode coupled to the second known potential.

13. The precharge device of claim 1 or 3 wherein the stabilizing element comprising of:
a transistor comprising a first and a second current electrode and a control electrode, the first current electrode coupled to the third node, the second current electrode coupled to the third node and the control electrode coupled to the first known potential.

14. The precharge device of claim 1 or 3 wherein the stabilizing element comprising of:
a plurality of the stabilizing elements comprising a first and a second current electrode and a control electrode, wherein the first current electrode or the second current electrode or the control electrode may be interconnected among each other and to the first known potential or the second known potential or to the third node without the plurality of the stabilizing element causing electrical short-circuit between the first known potential and the second known potential during precharge or evaluate phase.

15. A precharge device of claim 1 or 3 for Complementary Metal Oxide Semiconductor (CMOS) wherein the series-parallel network of transistors comprising:
a series or parallel or series-parallel or parallel-series network of transistors; or
the first terminal of two-terminal parallel-connected transistor network is coupled to the first node and the second terminal of the parallel-connected transistor network is coupled to the first terminal of two-terminal series-connected transistor network of zero or more transistors and the second terminal of two-terminal series-connected transistor network is coupled to the second node for each and every path from the first node to the second node through the transistor tree wherein the parallel-connected transistor network may be the largest possible while maintaining the equivalent boolean function for the precharge device.

16. A precharge device of claim 1 or 3 for strained or unstained Silicon-On Insulator (SOI) where the insulator may be oxide or nitride or carbide or Sapphire wherein the series-parallel network of transistors comprising:
a series-connected transistor network of zero or more transistors coupled between the second node and the first terminal of a two-terminal parallel-connected transistor network wherein the second terminal of the parallel-connected transistor is coupled to the second known voltage level for each and every path from the second node to the second known voltage level wherein the parallel-connected transistor network may be the largest possible while maintaining the equivalent boolean function for the precharge device.

17. A method, executed by a computer, of modifying the series-parallel network of transistors of claim 1 or 3 represented by a boolean expression comprised of a plurality of portions each of which is represented by a boolean expression, said method comprising the steps of:
forming a plurality of groups of transistor trees each represented by a boolean expression
by factoring the boolean expression, where each group corresponds to one of said plurality of portions, wherein the boolean expressions which represent transistor trees of each group are equivalent in function to a Boolean expression which represents one of said corresponding portions and are formed by modifying the boolean expression which represents the corresponding portion, so that one of the transistor trees of each group will have a delay time, transistor count, power consumption, glitch severity, leakage which is different from others of the transistor trees of each group; and
selecting one of the combinations which will have a delay time which is less than or equal to a predetermined delay time and lowering the total transistor count, power consumption, glitch severity, leakage among said combinations potentially along with one large or largest parallel transistor tree coupled to the first node after modification of the series-parallel network of transistors.

18. A precharge device of claim 1 or 3 wherein various transistors may be sized and forward biased, zero biased, or reverse biased, and different transistors may have different biases and different threshold voltages due to gate to body connections with voltages below the forward-bias voltage of Silicon or different threshold voltages as a result of selective implant and the timing signals may be adjusted to achieve desired results with a compromise between delay, power consumption, area, glitch size, leakage.

\* \* \* \* \*